(12) United States Patent
Huang et al.

(10) Patent No.: US 11,462,563 B2
(45) Date of Patent: Oct. 4, 2022

(54) MEMORY DEVICE AND MANUFACTURING METHOD THEREOF

(71) Applicant: Taiwan Semiconductor Manufacturing Company, Ltd., Hsinchu (TW)

(72) Inventors: Yong-Sheng Huang, Hsinchu (TW); Ming-Chyi Liu, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 222 days.

(21) Appl. No.: 17/012,056

(22) Filed: Sep. 4, 2020

(65) Prior Publication Data

US 2020/0403003 A1  Dec. 24, 2020

Related U.S. Application Data

(62) Division of application No. 16/171,353, filed on Oct. 25, 2018, now Pat. No. 10,784,278.

(60) Provisional application No. 62/712,205, filed on Jul. 30, 2018.

(51) Int. Cl.
  *H01L 27/11582* (2017.01)
  *H01L 23/528* (2006.01)
  *H01L 27/11568* (2017.01)
  *H01L 21/28* (2006.01)

(52) U.S. Cl.
  CPC .... *H01L 27/11582* (2013.01); *H01L 23/5283* (2013.01); *H01L 27/11568* (2013.01); *H01L 29/40117* (2019.08)

(58) Field of Classification Search
  CPC .......... H01L 27/11582; H01L 23/5283; H01L 27/11568; H01L 29/40117; H01L 27/11575; H01L 29/7926
  USPC ........................................................ 257/324
  See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Caleen O Sullivan
(74) *Attorney, Agent, or Firm* — JCIPRNET

(57) ABSTRACT

A memory device and a manufacturing method are provided. The method includes: forming a first conductive pattern on a substrate; forming an active structure over the first conductive pattern, wherein the active structure comprises a gate pattern, a channel pillar and a charge storage layer, the channel pillar penetrates the gate pattern and electrically connects with the first conductive pattern, and the charge storage layer is disposed between the gate pattern and the channel pillar; forming a second conductive pattern over the active structure, wherein the second conductive pattern is electrically connected with the channel pillar; and performing formation of the active structure one more time, such that the channel pillars of the active structures are vertically spaced apart from each other, and electrically connected to the second conductive pattern extending in between the channel pillars.

20 Claims, 13 Drawing Sheets

(56) References Cited

U.S. PATENT DOCUMENTS 9,608,116 B2    3/2017  Ching et al.
10,784,278 B2 *  9/2020  Huang ................ H01L 29/7926

* cited by examiner

MEMORY DEVICE AND MANUFACTURING METHOD THEREOF

CROSS-REFERENCE TO RELATED APPLICATION

This application is a divisional application of and claims the priority benefit of a prior application Ser. No. 16/171,353, filed on Oct. 25, 2018. The prior application Ser. No. 16/171,353 claims the priority benefits of U.S. provisional application Ser. No. 62/712,205, filed on Jul. 30, 2018. The entirety of each of the above-mentioned patent applications is hereby incorporated by reference herein and made a part of this specification.

BACKGROUND

Flash memory has become a powerful and cost-effective solid-state storage technology widely used in mobile electronics and other consumer applications. NAND flash and NOR flash are two major forms of flash memory. In the internal circuit configuration of NOR flash, the individual memory cells are connected in parallel, and this configuration enables a short read time. As such, NOR flash is ideal for high-speed read applications, which are often referred to as code-storage applications. However, NOR flash is currently formed as a two-dimensional structure, such that a cell density of NOR flash is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
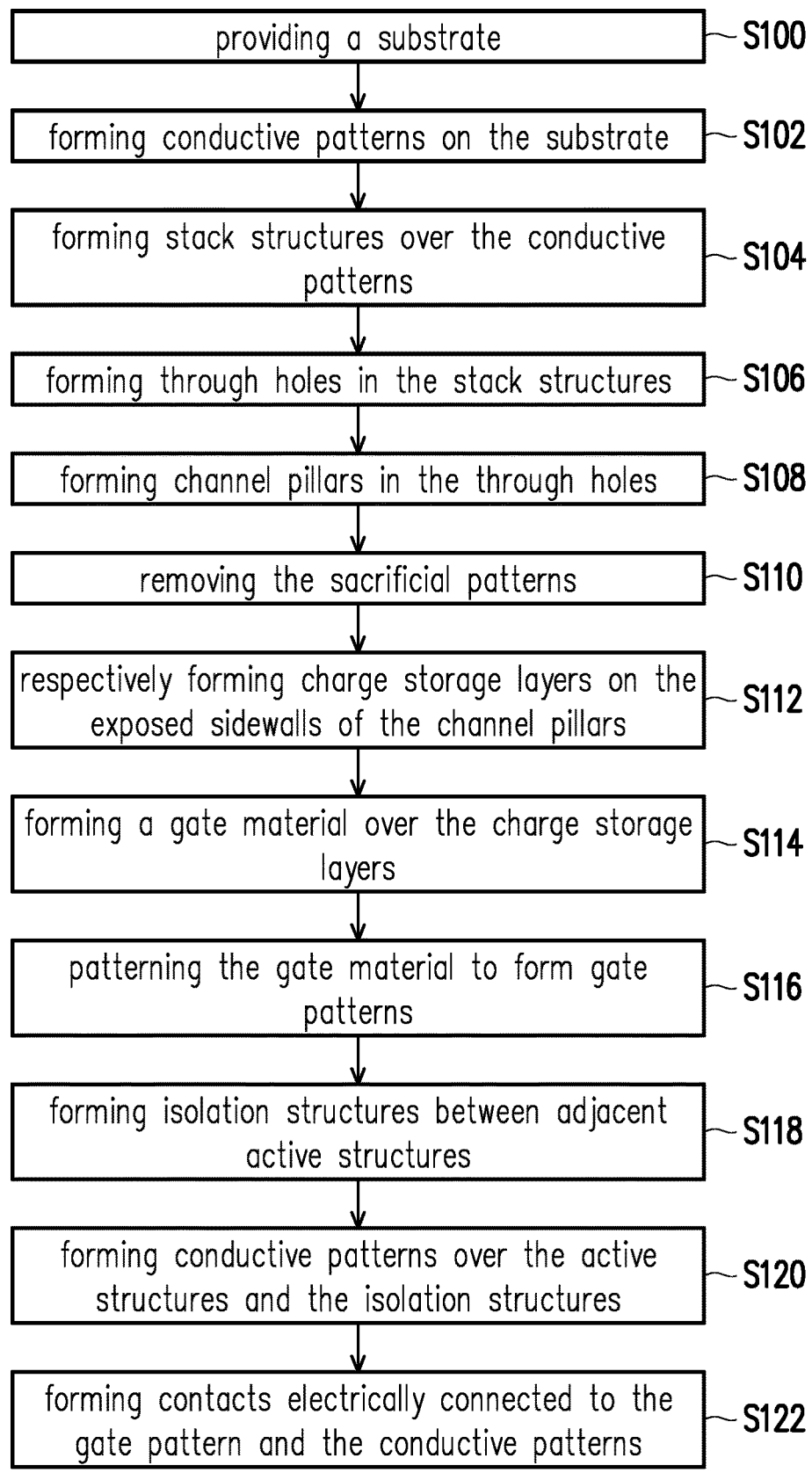
FIG. 1 is a process flow for a manufacturing method of a memory device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that may be embodied in a wide variety of specific contexts. The embodiments are intended to provide further explanations but are not used to limit the scope of the present disclosure.

Embodiments will be described with respect to a specific context, namely a memory device, such as a NOR flash memory device. Other embodiments may also be applied, however, to other circuits and layouts. Throughout the various views and illustrative embodiments, like reference numbers are used to designate like elements.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a process flow for a manufacturing method of a memory device according to some embodiments. FIG. 2A through FIG. 2L are three dimensional view of structures at various stages of the manufacturing method of the memory device shown in FIG. 1.

Figure 2A:
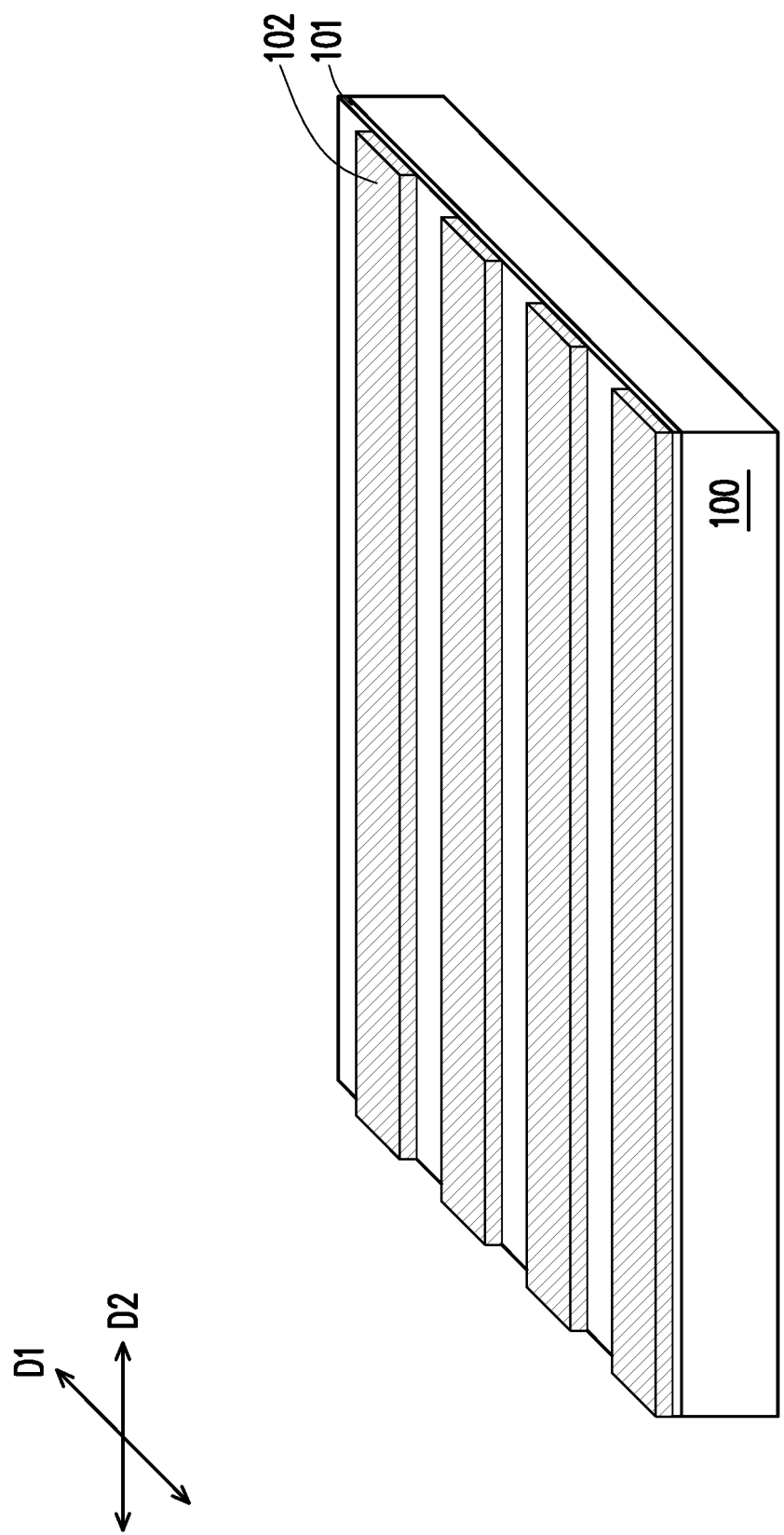
FIG. 2A through FIG. 2L are three dimensional view of structures at various stages of the manufacturing method of the memory device shown in FIG. 1.

Referring to FIG. 1 and FIG. 2A, step S100 is performed, and a substrate 100 is provided. In some embodiments, the substrate 100 may include a semiconductor wafer, a semiconductor-on-insulator (SOI) wafer or an epitaxial wafer. The semiconductor wafer, the SOI wafer or the epitaxial wafer may include an elemental semiconductor material or a compound semiconductor material. For instance, the elemental semiconductor may include Si or Ge. The compound semiconductor may include SiGe, SiC, SiGeC, a III-V semiconductor or a II-VI semiconductor. For instance, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

In some embodiments, an insulating layer 101 is formed on the substrate 100. The insulating layer 101 may be formed by a thermal growth method or a chemical vapor deposition (CVD) method, a lamination method, a spin coating method, the like or combinations thereof. A material of the insulating layer 101 may include silicon oxide, silicon nitride, polymer or combinations thereof. In some embodiments, the insulating layer 101 is a single layer. In other embodiments, the insulating layer 101 may be a multilayer structure.

Step S102 is performed, and conductive patterns 102 are formed on the substrate 100. In some embodiments, a formation method of the conductive patterns 102 includes forming a conductive layer (not shown) on the substrate 100, and then patterning the conductive layer to form the conductive patterns 102. The conductive layer may be formed by a chemical vapor deposition method, a physical vapor deposition (PVD) method, a plating method or combinations thereof. For instance, the PVD method is such as sputtering, and the plating method is such as electroplating or electroless plating. In some embodiments, a material of the conductive patterns 102 may include polysilicon, which may be intrinsic or may be doped with a first conductive type or a second conductive type complementary to the first conductive type. For instance, the first conductive type may be n type, whereas the second conductive type may be p type. In alternative embodiments, the material of the conductive patterns 102 may include a metal material, such as Al, Cu, the like or combinations thereof. A thickness of the conductive patterns 102 may range from about 50 Å to about 500 Å. In some embodiments, the conductive patterns 102 are arranged along a first direction D1, and extend along a second direction D2 intersected with the first direction D1. As such, the conductive patterns 102 may be formed as strips over the substrate 100. In some embodiments, the second direction D2 is intersected with the first direction D1. For instance, the second direction D2 is substantially perpendicular to the first direction D1.

Figure 2B:
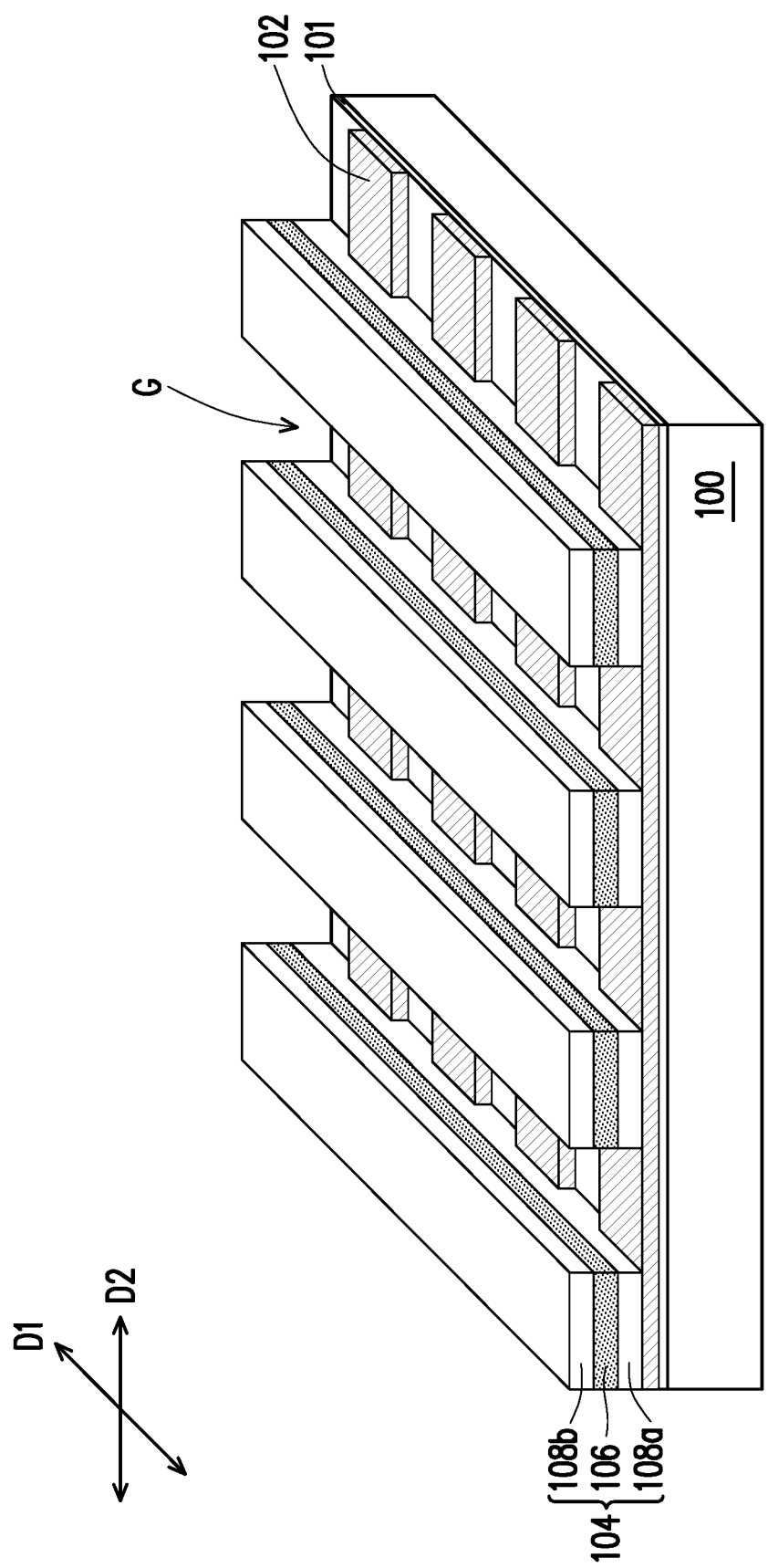

Referring to FIG. 1 and FIG. 2B, step S104 is performed, and stack structures 104 are formed over the first conductive patterns 102. The stack structures 104 includes a sacrifice pattern 106 sandwiched between a first dielectric pattern 108a and a second dielectric pattern 108b. In some embodiments, a formation method of the stack structures 104 includes sequentially forming a first dielectric layer, a sacrificial layer and a second dielectric layer (not shown) on the substrate 100. The first dielectric layer, the sacrificial layer and the second dielectric layer may be formed by a CVD method, a lamination method, a spin coating method, the like or combinations thereof. In some embodiments, a material of the sacrificial layer has an etching selectivity with respect to a material of the first and second dielectric layers. For instance, the material of the first and second dielectric layers may include silicon oxide, whereas the material of the sacrificial layer may include silicon nitride. The first dielectric layer, the sacrificial layer and the second dielectric layer are then patterned to form the stack structures 104 each including the first dielectric pattern 108a, the sacrificial pattern 106 and the second dielectric pattern 108b. A thickness of the first dielectric pattern 108a may range from about 200 Å to about 400 Å, a thickness of the sacrificial pattern 106 may range from about 500 Å to about 800 Å, and a thickness of the second dielectric pattern 108b may range from about 200 Å to about 400 Å. In some embodiments, the stack structures 104 are formed as strips that extend along the first direction D1, and are arranged along the second direction D2. A gap G is in between adjacent stack structures 104. In these embodiments, each conductive pattern 102 is intersected with multiple stack structures 104 from below the stack structures 104. In addition, each stack structure 104 is intersect with multiple conductive patterns 102 from above the conductive patterns 102.

Figure 2C:
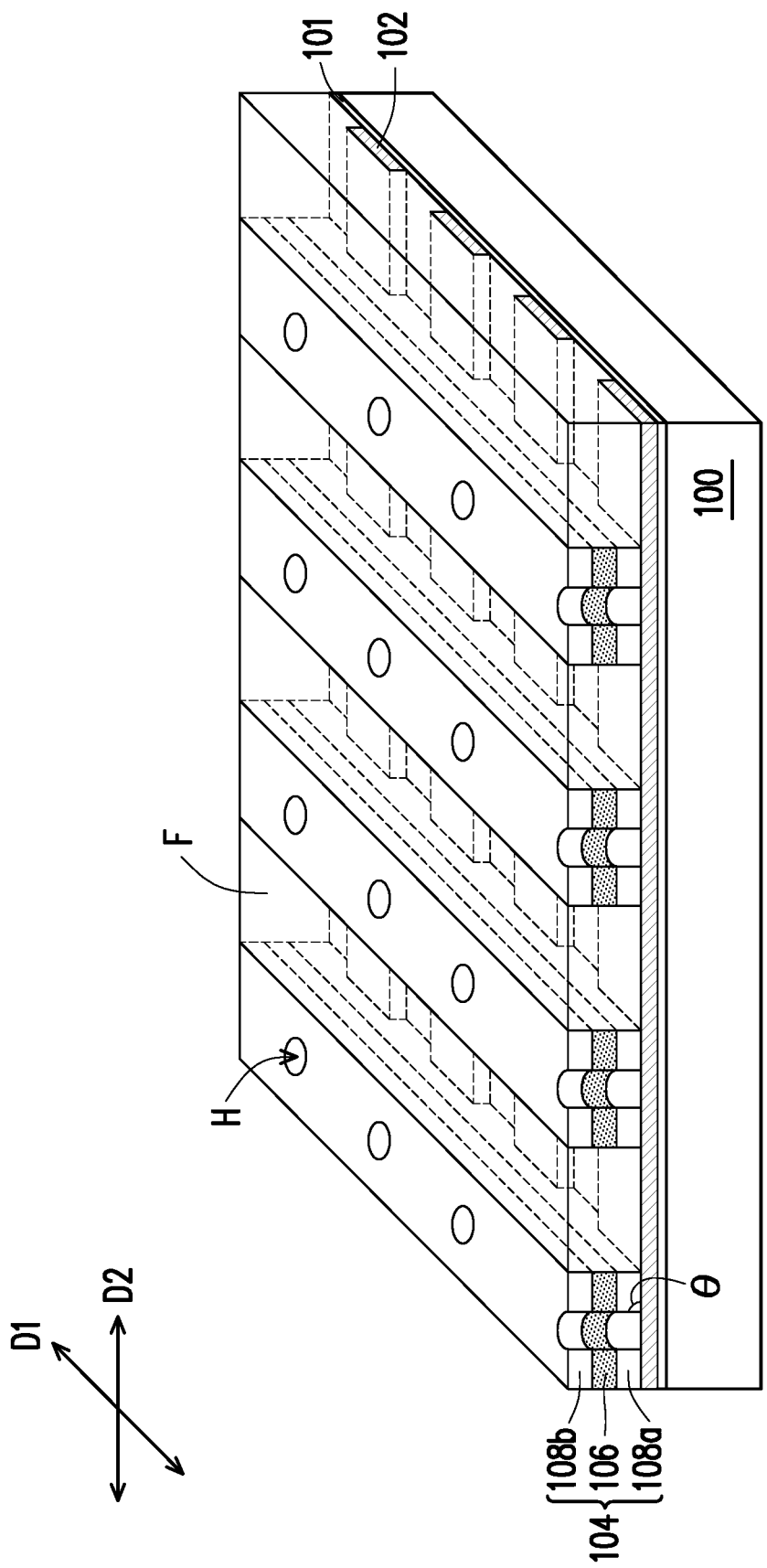

Referring to FIG. 1 and FIG. 2C, step S106 is performed, and through holes (or referred to as through trenches) H are formed in the stack structures 104. The through hole H penetrates one of the stack structures 104 to expose the underlying first conductive pattern 102. In other words, the through hole H is located at an intersection area of one of the stack structure 104 and the underlying first conductive pattern 102. In addition, the through hole H may be regarded as being surrounded by the corresponding stack structure 104. In some embodiments, a shape of the through hole H in a top view may be circular, rectangular, trigonal, polygonal or irregular. In some embodiments, a sidewall of the through hole H may be substantially perpendicular to the surface of the substrate 100. In other embodiments, an angle θ between an extension direction of the sidewall of the through hole H and a surface of the substrate 100 may slightly greater than or slightly less than 90°. A method of forming the through holes H may include a lithography and an anisotropic etching, such as dry etching. An etchant of the dry etching process may include $C_4H_8$, Ar, $O_2$, the like or combinations thereof. In addition, the through holes H may be formed in a single anisotropic etching process, or may be formed by multiple anisotropic etching processes each performed to remove a portion of at least one of the first dielectric pattern 108a, the sacrificial pattern 106 and the second dielectric pattern 108b.

In some embodiments, before forming the through holes H, a gap filling material F is formed in the gaps G (as shown in FIG. 2B) between adjacent stack structures 104. In some embodiments, a material of the gap filling material F may be the same as the material of the sacrificial pattern 106, but the present disclosure is not limited thereto. The gap filling material F may be formed to extend onto a top surface of the stack structures 104. Afterwards, a planarization method, such as a chemical mechanical polish (CMP) process an etching back process or combinations thereof, may be performed to remove a portion of the initially formed gap filling material F over the top surface of the stack structures 104. As such, a top surface of the gap filling material F may be substantially coplanar with the top surface of the gap filling material F. In these embodiments, adjacent stack structures 104 are separated by the gap filling material F.

Figure 2D:
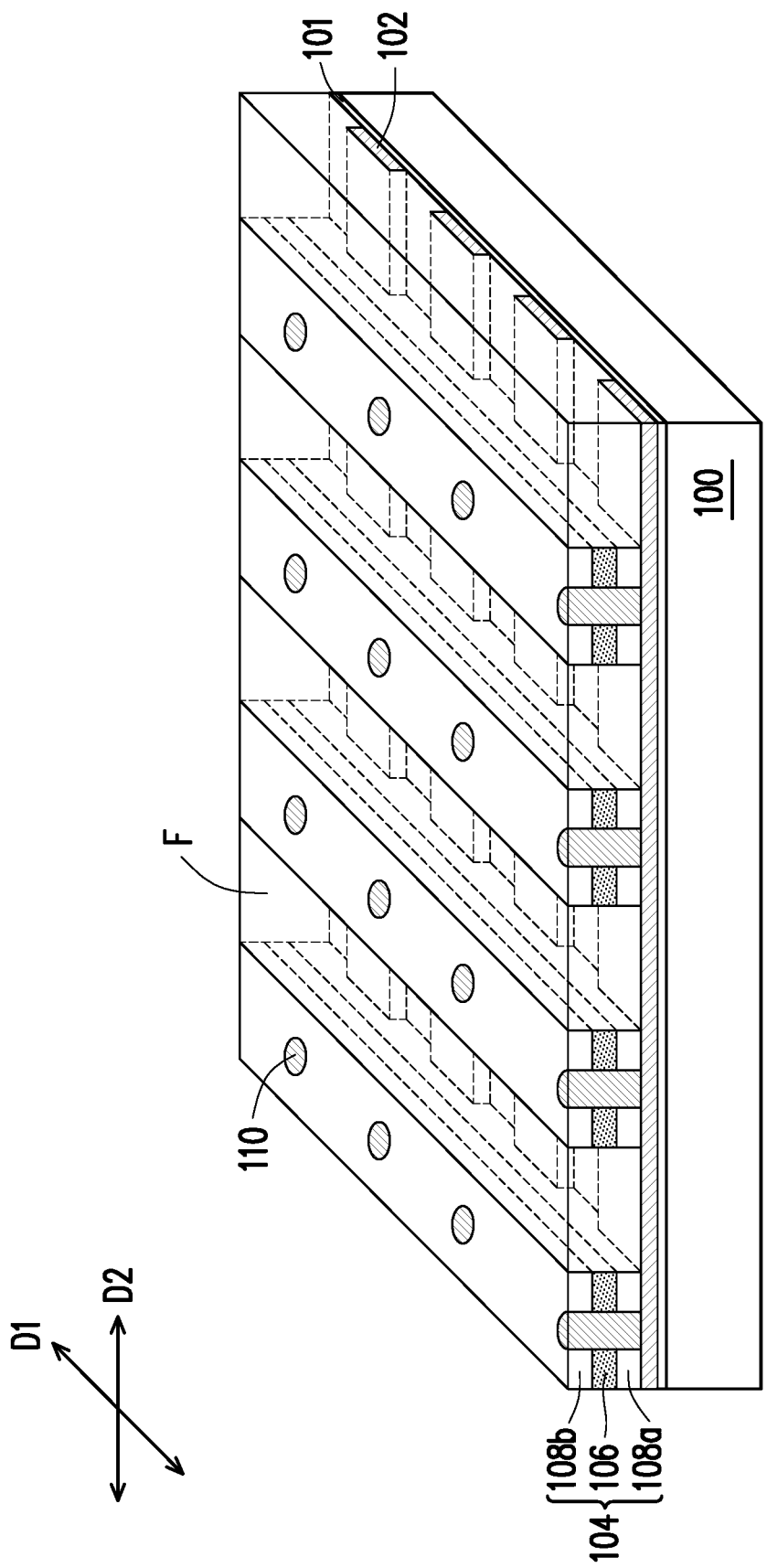

Referring to FIG. 1 and FIG. 2D, step S108 is performed, and channel pillars 110 are respectively formed in the through holes H. In some embodiments, the channel pillar 110 is surrounded by the corresponding sacrificial pattern 106 and first and second dielectric patterns 108a and 108b. In some embodiments, a material of the channel pillars 110 may be initially formed to fill the through holes H and extend onto the top surface of the stack structures 104 and the gate filling material F. Thereafter, a planarization process, such as a CMP process, an etching back process or combinations thereof, may be performed to remove a portion of the initially formed channel pillars 110 over the top surface of the stack structures 104. As such, a top surface of the channel pillars 110 is substantially coplanar with the top surface of the stack structures 104 and the gap filling material F. In some embodiments, the material of the channel pillar 110 includes a doped or intrinsic semiconductor material, such as polysilicon, SiGe, SiC or the like. In addition, the channel pillar 110 may be formed by a CVD method, an epitaxial method or combinations thereof.

Figure 2E:
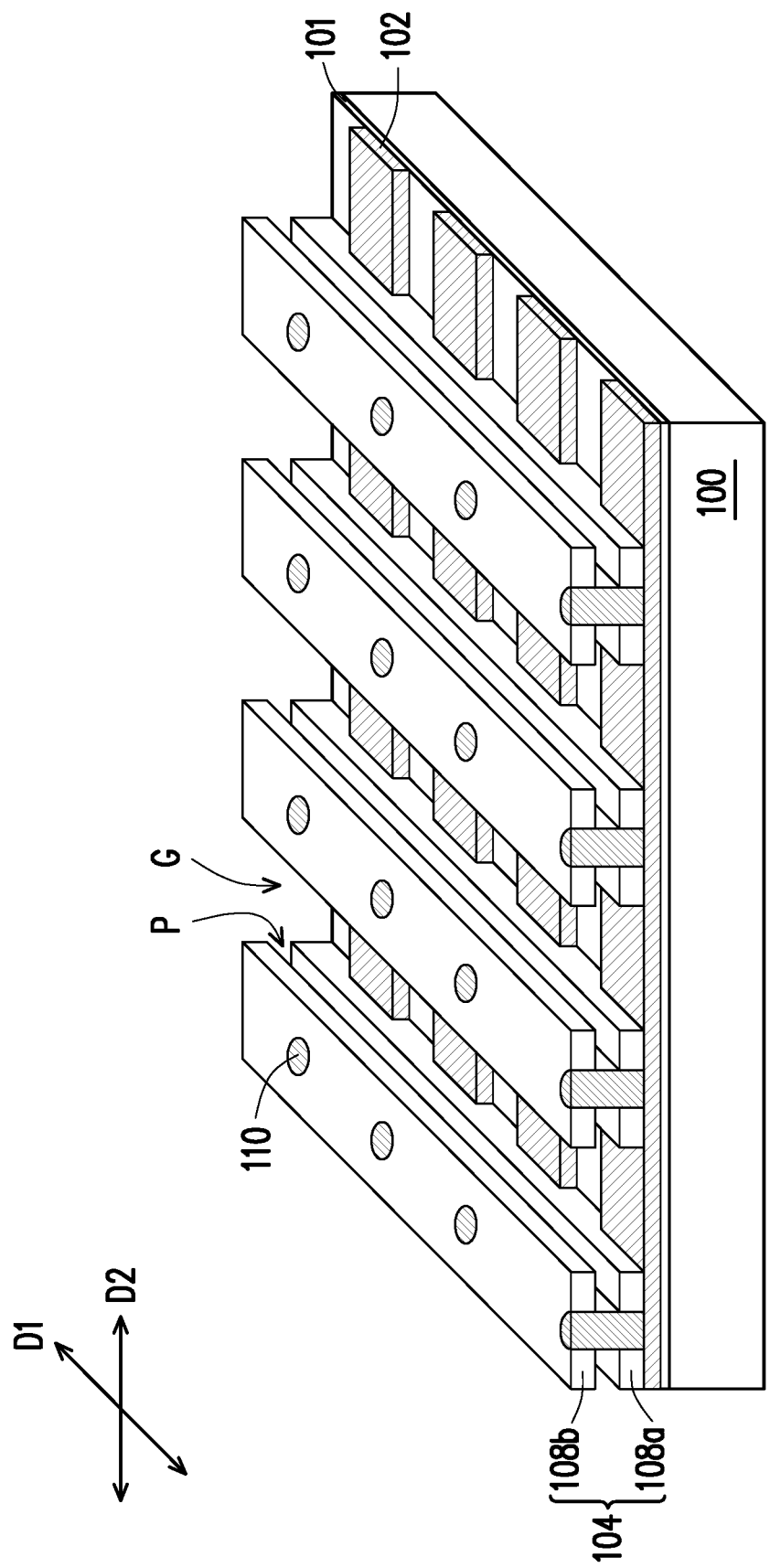

Referring to FIG. 1 and FIG. 2E, step S110 is performed, and the sacrificial patterns 106 are removed. As such, an opening P between one of the first dielectric patterns 108a and the overlying second dielectric pattern 108b are formed. A portion of a sidewall of the channel pillar 110, a top surface of the first dielectric pattern 108a and a bottom surface of the second dielectric pattern 108b are exposed by the corresponding opening P. In some embodiments in which the gap filling material F and the sacrificial layer 106 are made of the same or similar material, the gap filling material F is removed along with the sacrificial patterns 106, such that the opening P is communicated with adjacent gap G. Moreover, a portion of the substrate 100 and a portion of the conductive patterns 102 are exposed. In some embodiments, a method of removing the sacrificial patterns 106 (or the sacrificial patterns 106 and the gap filling material F) includes an isotropic etching. For instance, the isotropic etching may be a wet etching performed by using etchant such as phosphoric acid at a temperature ranging from about 100° C. to about 150° C. After the sacrificial patterns 106 are removed, the stack structures 104 are supported by the channel pillars 110 from being collapsed.

Figure 2F:
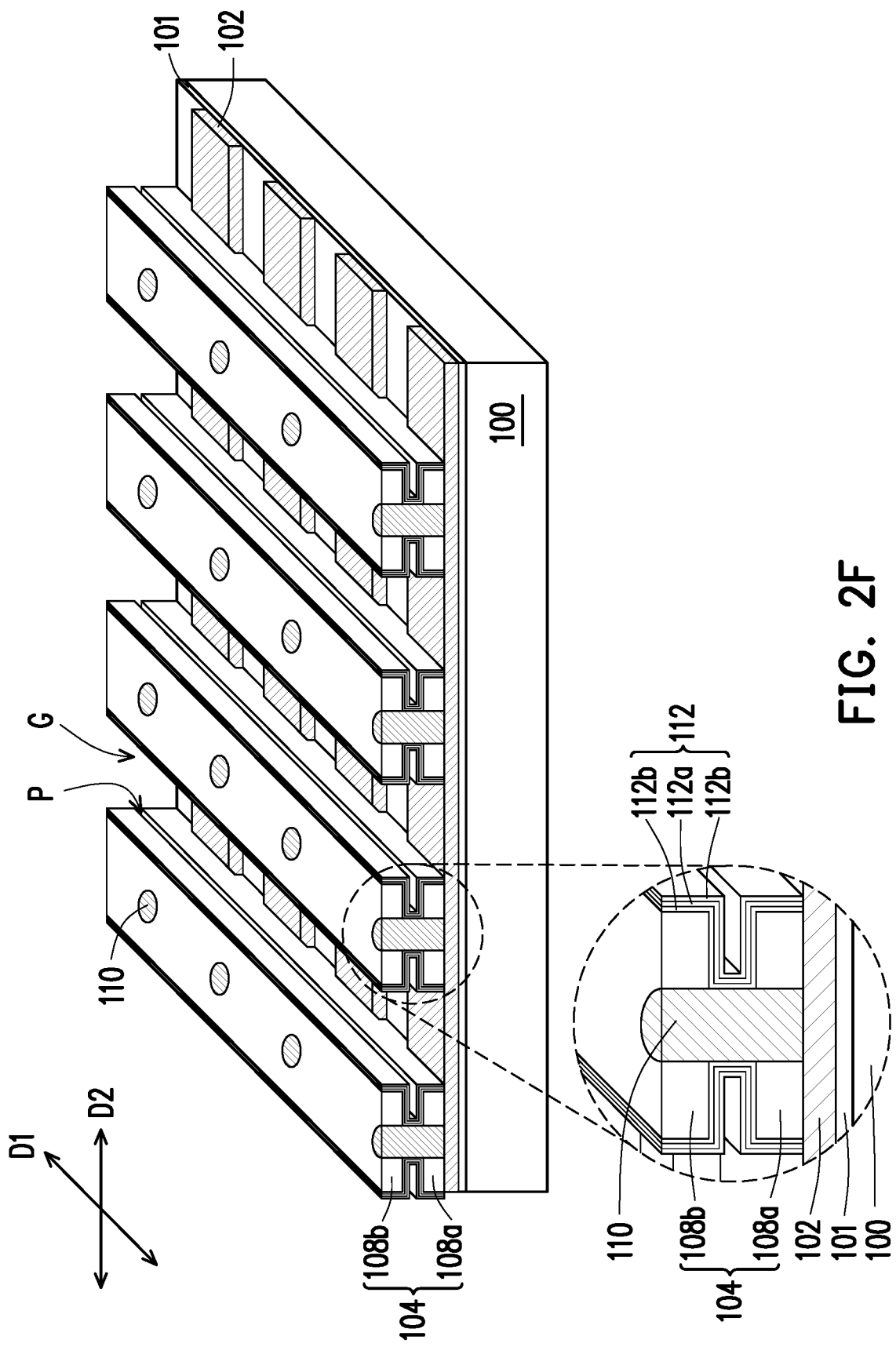

Referring to FIG. 1 and FIG. 2F, step S112 is performed, and charge storage layers 112 are formed on the sidewalls of the channel pillars 110 exposed by the opening P, respectively. In some embodiments, charge storage layer 112 is a multilayer structure containing at least one oxide layer and at least one nitride layer. For instance, as shown in the dash line region, the multilayer structure may be an oxide/nitride/oxide multilayer structure including a silicon nitride layer 112a sandwiched between two silicon oxide layers 112b. As another example, the multilayer structure may be an oxide/nitride/oxide/nitride/oxide multilayer structure, of which each silicon nitride is sandwiched between two of the silicon oxide layers. A thickness of each silicon oxide layer 112b may range from about 30 Å to about 60 Å, and a thickness of the silicon nitride layer 112a may range from about 60 Å to about 120 Å. In some embodiments, a formation method of the charge storage layers 112 includes forming multiple material layers (not shown), such as an oxide/nitride/oxide multilayers or oxide/nitride/oxide/nitride/oxide multilayers, on the exposed surface of the structure shown in FIG. 2E. The material layers may be formed by an atomic layer deposition (ALD) method, a CVD method or combinations thereof. Afterwards, a portion of the material layers over the substrate 100 and the conductive patterns 102 between adjacent stack structures 104 is removed, as well as another portion of the material layers over the stack structures 104. In some embodiments, the portions of the material layers may be removed by, for example, an anisotropic etching. As a result of removing the portions of the material layers, the charge storage layers 112 in the openings P is formed as shown in FIG. 2F. In other words, charge storage layer 112 is located on the sidewall of channel pillar 110, and extends onto a top surface of the corresponding first dielectric pattern 108a and a bottom surface of the overlying second dielectric pattern 108b. In some embodiments, the charge storage layer 112 may further extend onto sidewalls of the first and second dielectric patterns 108a and 108b.

Figure 2G:
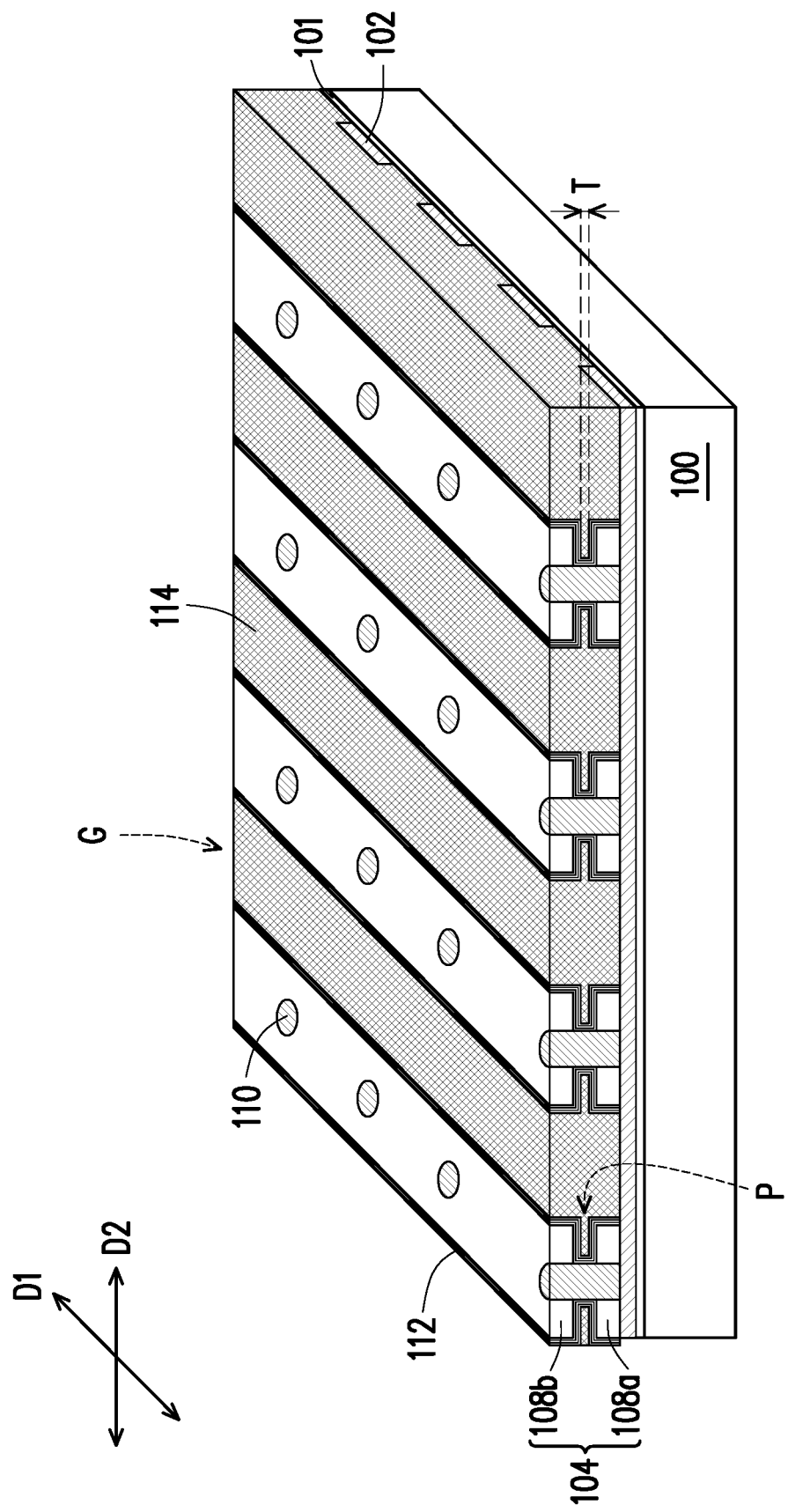

Referring to FIG. 1 and FIG. 2G, step S114 is performed, and a gate material 114 is formed over the charge storage layers 112. In some embodiments, the gate material 114 is formed to fill up the openings P in the stack structures 104 and the gaps G between adjacent stack structures 104. As such, the charge storage layer 112 is located between the channel pillar 110 and the corresponding gate material 114, and may be located between the corresponding gate material 114 and the first/second dielectric pattern 108a/108b. In some embodiments, the channel pillar 110 is surrounded by the corresponding gate material 114. The gate material 114 may be initially formed to extend onto the top surface of the stack structures 104. Thereafter, a planarization process, such as a CMP process or an etching back process, may be performed to remove a portion of the gate material 114 over the top surface of the stack structures 104. In some embodiments, a material of the gate material 114 has an etching selectivity with the material of the underlying conductive pattern 102. For instance, the gate material 114 may include a metal material, such as Al, W, the like or combinations thereof. The gate material 114 may be formed by a CVD method, a PVD method or the like. For instance, the PVD method may include sputtering or ALD. In some embodiments, a thickness of a portion of the gate material 114 in the opening P has a thickness T ranging from about 250 Å to about 550 Å.

Figure 2H:
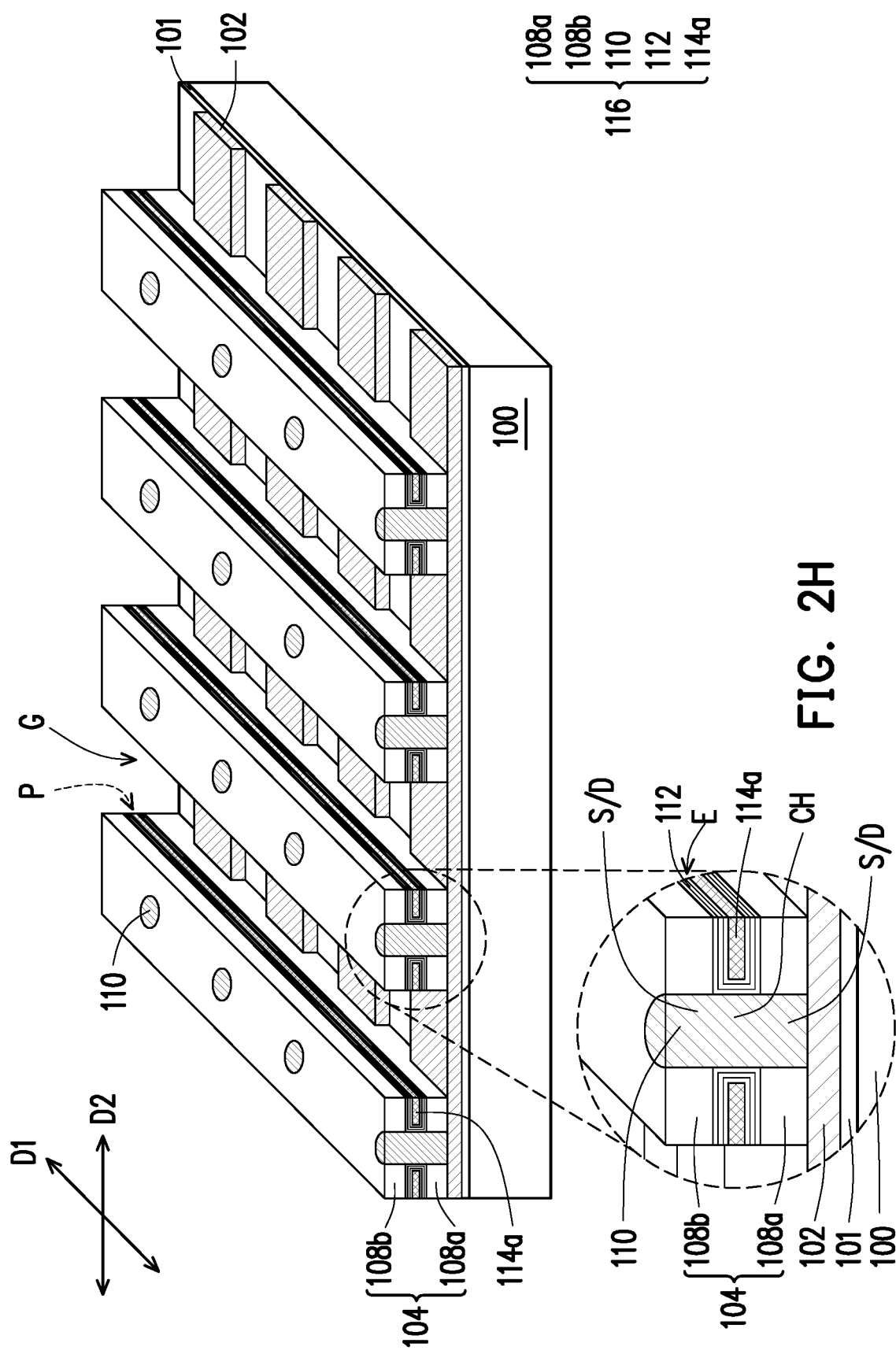

Referring to FIG. 1 and FIG. 2H, step S116 is performed, and a portion of the gate material 114 is removed to form gate patterns 114a within the openings P by, for instance, an anisotropic etching. In some embodiments, the portion of the gate material 114 located between adjacent stack structures 104 is removed, such that a portion of the substrate 100 and a portion of the conductive patterns 102 between adjacent stack structures 104 are exposed. In some embodiments, the portion of the charge storage layer 112 on the sidewalls of the first and second dielectric patterns 108a and 108b may be removed along with a portion of the gate material 114 between adjacent stack structures 104 during the patterning process performed in step S116. In these embodiments, a sidewall of the gate pattern 114a, end portions E of the charge storage layer 112 and the sidewalls of the first and second dielectric patterns 108a and 108b within the same stack structure 104 may be substantially coplanar with one another.

The channel pillar 110, the charge storage layer 112 and the gate pattern 114a within the same stack structure 104 may be referred as an active structure 116. In some embodiments, the active structure 116 further includes the first and second dielectric patterns 108a and 108b. The active structure 116 is, for instance, a field effect transistor. A portion of the channel pillar 110 close to the gate pattern 114a may be functioned as a channel region CH of the transistor. Portions of the channel pillar 110 at opposite sides of the gate pattern 114a may be functioned as source and drain regions S/D of the transistor. The gate pattern 114a may be functioned as a gate electrode of the transistor. The charge storage layer 112 may be functioned as both of a tunneling layer and a charge trapping layer of the transistor. In some embodiments, the active structures 116 extend along the first direction D1 over the conductive patterns 102 that are extending along the second direction D2.

Figure 2I:
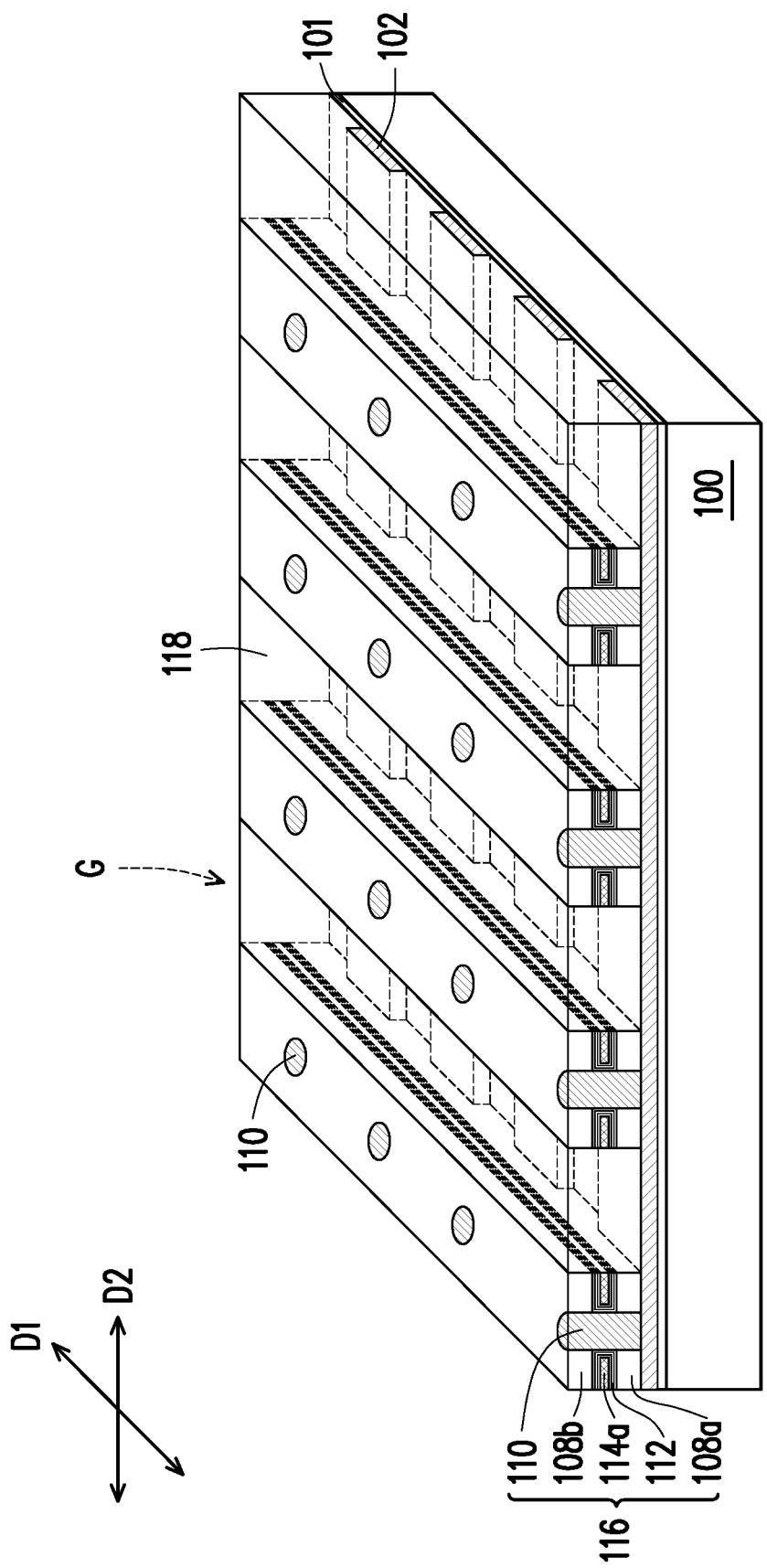

Referring to FIG. 1 and FIG. 2I, step S118 is performed, and isolation structures 118 are formed that each between adjacent active structures 116. A formation method of the isolation structures 118 may include initially forming an insulating layer (not shown) to fill up the gap G between adjacent active structures 116 and extend onto the top surface of the active structures 116. A material of the insulating layer may include silicon oxide, silicon nitride, the like or combinations thereof. The insulating layer may be formed via a CVD method. Thereafter, a planarization process, such as a CMP process or an etching back process, is performed to remove a portion of the insulating layer over the top surface of the active structures 116, so as to form the isolation structures 118.

Figure 2J:
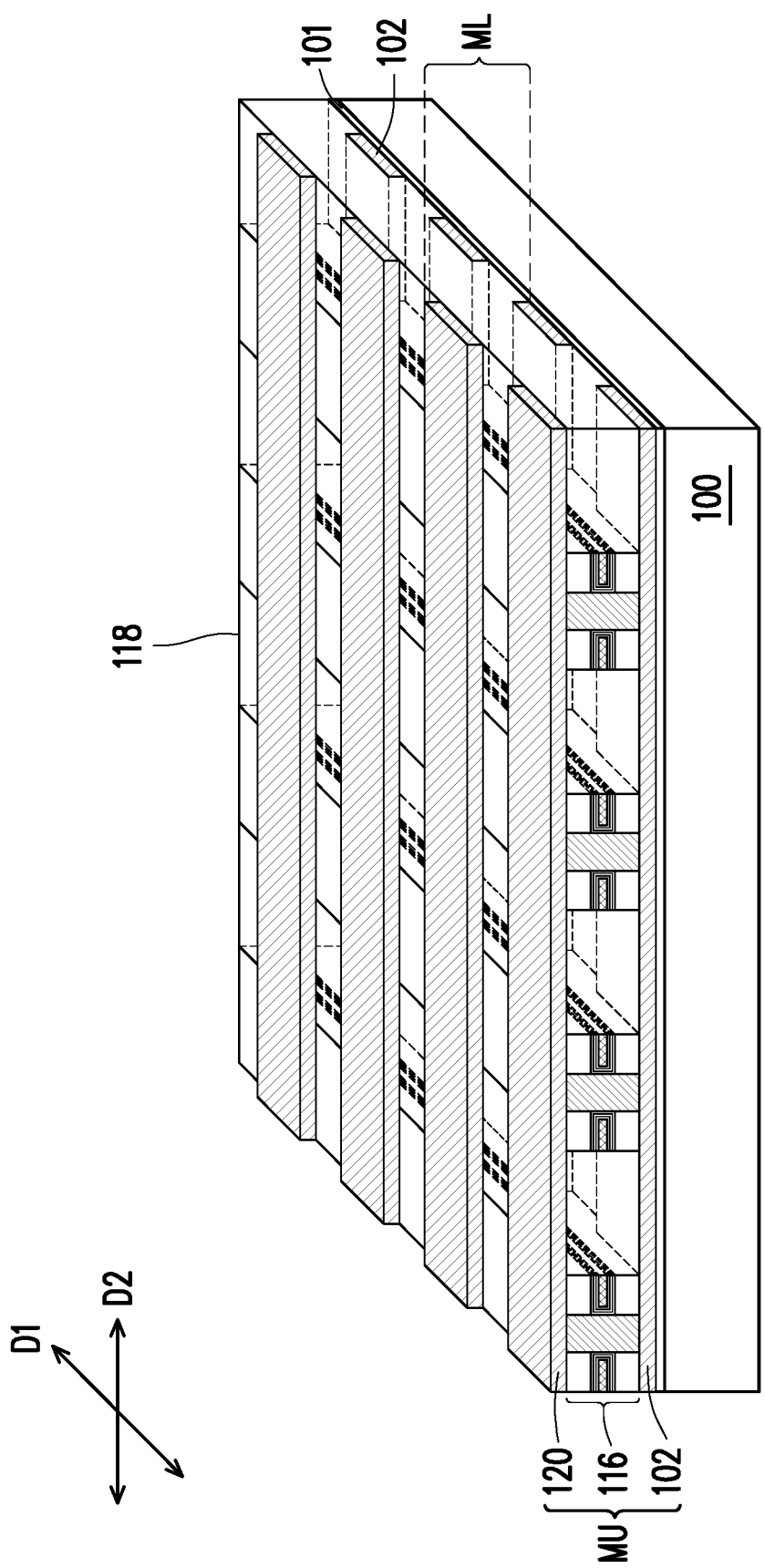

Referring to FIG. 1 and FIG. 2J, step S120 is performed, and conductive patterns 120 are formed over the active structures 116 and the isolation structures 118. In some embodiments in which the active structures 116 extend along the first direction D1, the conductive patterns 102 and the conductive patterns 120 extend along the second direction D2. The conductive patterns 120 are electrically connected with the channel pillars 110 from above the active structures 116. In other words, channel pillar 110 is electrically connected between the conductive patterns 102 and the conductive pattern 120. A formation method of the conductive patterns 120 may include forming a conductive layer (not shown) on the active structures 116 and the isolation structures 118. The conductive layer is then patterned to form the conductive patterns 120. The conductive layer may be formed by a CVD method, a PVD method, a plating method or combinations thereof. For example, the PVD method may include sputtering, and the plating method may include electroplating or electro-less plating. In some embodiments, the material of the conductive patterns 120 may include polysilicon, which may be intrinsic or may be doped with the first conductive type or the second conductive type. In other embodiments, the material of the conductive patterns 120 may include a metal material, such as Al, Cu, the like or combinations thereof. A thickness of the conductive patterns 120 may range from about 50 Å to about 500 Å.

So far, referring to FIG. 2H and FIG. 2J, the active structure 116 and the conductive patterns 102 and 120 electrically connected at opposite sides of this active structure 116 form a memory cell MU. The gate pattern 114a is functioned as a gate electrode as well as a word line of the memory cell MU. A portion of the channel pillar 110 close to the gate pattern 114a is functioned as a channel region CH of the memory cell MU. Opposite ends of the channel pillar 110 are functioned as source and drain regions S/D of the memory cell MU, and are electrically connected with the conductive patterns 102 and 120 each functioned as a source line or a bit line. The charge storage layer 112 may be functioned as both of a tunneling layer and a charge trapping layer of the memory cell MU. A plurality of the memory cells MU are formed at a single level ML defined by a bottom surface of the conductive patterns 102 to a top surface of the conductive patterns 120. The memory level ML has a plurality of columns of the memory cells MU extending along the first direction D1 and a plurality of rows of the memory cells MU extending along the second direction D2. Each column of the memory cells MU shares the same gate pattern 114a (i.e., the word line), and adjacent columns of the memory cells MU are separated by one of the isolation structures 118. In addition, each row of the memory cells MU shares the same pair of conductive patterns 102 and 120 (i.e., the source and bit lines).

Figure 2K:
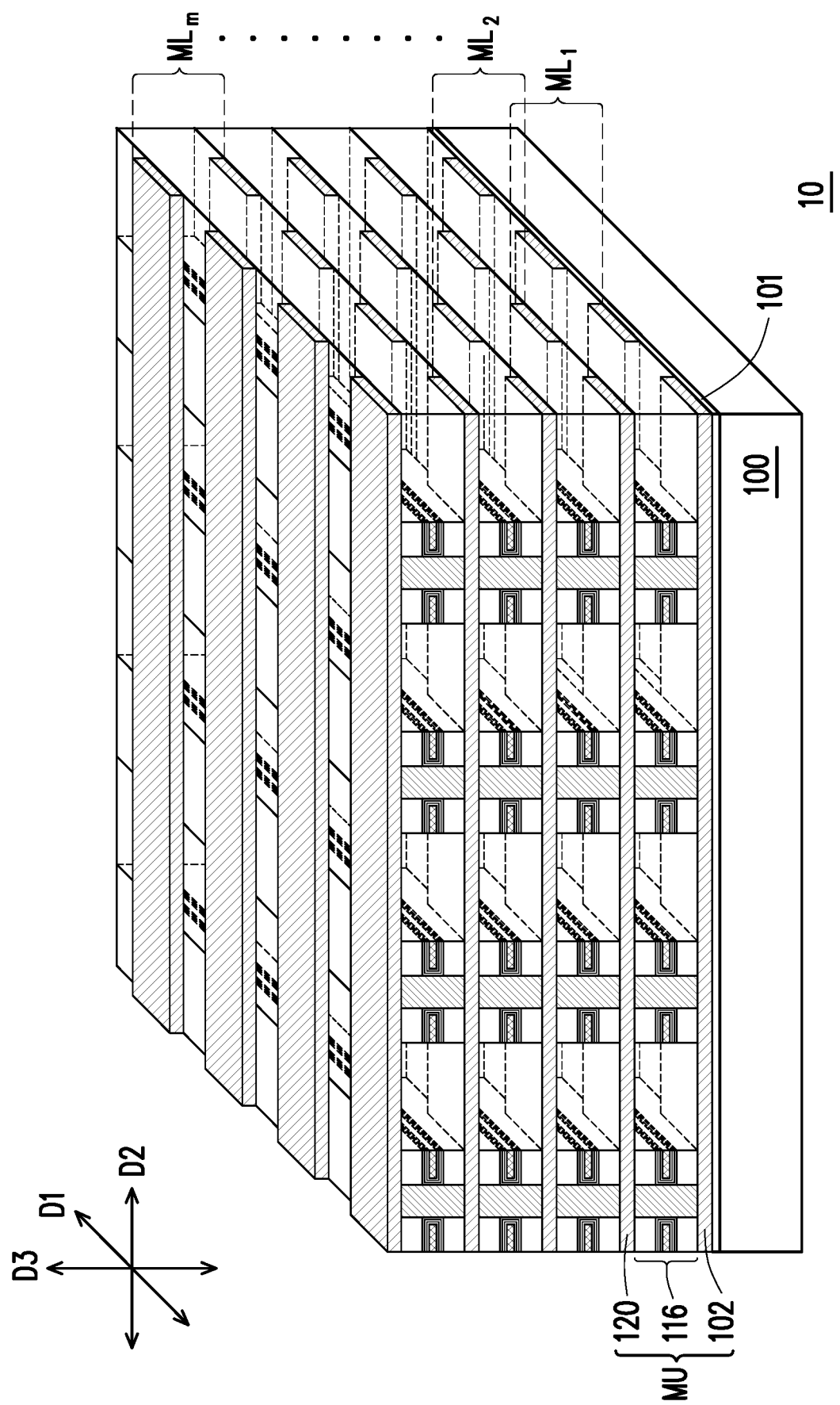

Referring to FIG. 1 and FIG. 2K, step S104 through step S120 are repeated a plurality of times, and a three dimensional memory device 10 is formed. The memory device 10 includes multiple levels $ML_1$ through $ML_m$ of the memory cells MU stacked on the first level $ML_1$ shown in FIG. 2J along a third direction D3. For instance, m is an integer ranging from 12 to 36. The third direction D3 is substantially perpendicular to a surface of the substrate 100. In some embodiments, vertically adjacent memory cells MU are overlapped with each other, and share the same conductive pattern 120, which is functioned as a source line or a bit line. In these embodiments, vertically adjacent memory cells MU are connected in parallel. For instance, the memory cell 10 is a NOR flash memory device.

Figure 2L:
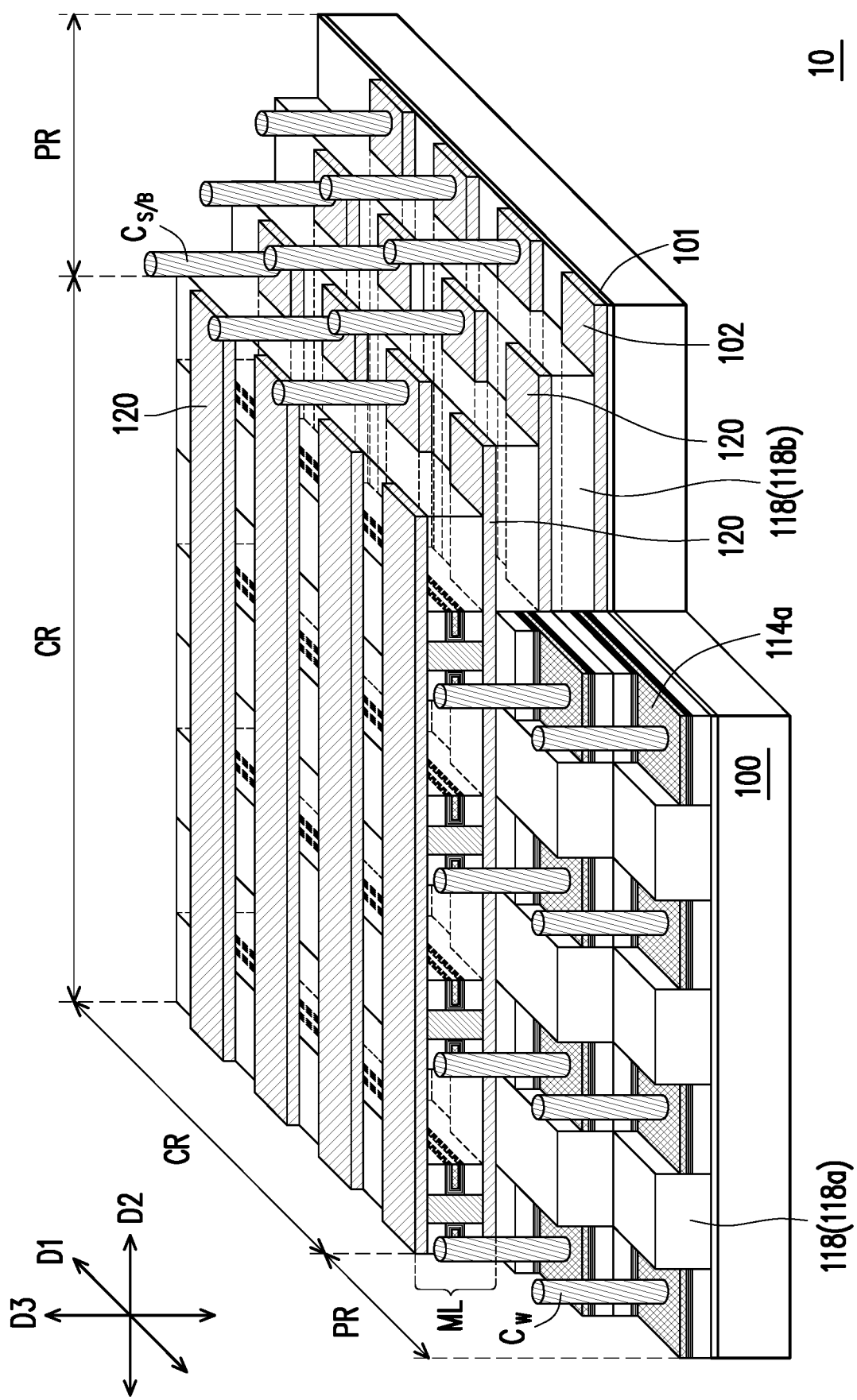

Referring to FIG. 1 and FIG. 2L, step S122 is performed, and contacts $C_W$ and $C_{S/B}$ are formed. It should be noted that some of the levels ML of the memory cells MU are omitted in FIG. 2L for simplicity. The contacts $C_W$ are electrically connected with the gate patterns 114a, respectively. In addition, the contacts $C_{S/B}$ are electrically connected with the conductive patterns 102/120, respectively. In some embodiments, the contacts $C_W$ and $C_{S/B}$ are formed within a peripheral region PR around a central region CR in which the stack of memory cells MU are located. The first and second dielectric patterns 108a and 108b, the charge storage layers 112, the gate patterns 114a and a first portion 118a of the isolation structures 118 extend into the peripheral region PR along the first direction D1, and the conductive patterns 102/120 and a second portion 118b of the isolation structures 118 extend into the peripheral region PR along the second direction D2. The first portion 118a of the isolation structures 118 is respectively located between adjacent gate patterns 114a, and the second portion 118b of the isolation structures 118 is located close to an edge of the central region CR. In some embodiments, the first and second dielectric patterns 108a and 108b, the charge storage layers 112, the gate patterns 114a and the first portion of the isolation structures 118 extending into the peripheral region PR are patterned to form a plurality of stairs. As such, an end of each gate pattern 114a within the peripheral region PR is recessed from an end of an underlying one of the gate patterns 114a, as well as the first and second dielectric patterns 108a and 108b, the charge storage layers 112 and the first portion 118a of the isolation structures 118. Similarly, an end of each conductive pattern 102/120 within the peripheral region PR is recessed from an end of an underlying one of the conductive pattern 102/120, as well as the second portion 118b of the isolation structures 118. The contacts $C_W$ are respectively formed on the stairs of the gate patterns 114a within the peripheral region PR, and the contacts $C_{S/B}$ are respectively formed on the stairs of the conductive patterns 102/120 within the peripheral region PR. In some embodiments, a formation method of the contacts $C_W$ and $C_{S/B}$ includes forming a dielectric layer (not shown) over the stairs. Thereafter, a plurality of contact holes (not shown) are formed in the dielectric layer, then the contacts $C_W$ and $C_{S/B}$ are filled in the contact holes respectively.

Referring to FIG. 2I through FIG. 2L, the memory device 10 includes memory cells MU stacking on the substrate 100. The memory cell MU includes the channel pillar 110, the charge storage layer 112, the gate pattern 114a, and two conductive patterns 102/120. The conductive patterns 102/120 are stacked on the substrate 100, and may be functioned as a source line and a bit line. The conductive patterns 102/120 extend along the second direction D2. The channel pillar 110 extends between the conductive patterns 102/120 along a stacking direction of the conductive patterns 102/120, and electrically connected with the conductive patterns 102/120. The gate pattern 114a is disposed between the conductive patterns 102/120 and located at a sidewall of the channel pillar 110. Viewing from another angle, the channel pillar 110 may be regarded as penetrating through the gate pattern 114a, or the channel pillar 110 is surrounded by the gate pattern 114a. The gate pattern 114a may be functioned as a word line, and extends along the first direction D1. In some embodiments, the memory cell MU further includes the first and second dielectric patterns 108a and 108b. The first and second dielectric patterns 108a and 108b are respectively located between the gate pattern 114a and the conductive patterns 102/120. In some embodiments, the memory device 10 further includes isolation structures 118 between gate patterns 114a in adjacent memory cells MU. The isolation structures 118 may each separate adjacent conductive patterns 102/120.

As shown in FIG. 2I, the charge storage layer 112 is disposed between the gate pattern 114a and the channel pillar 112. In some embodiments, the charge storage layer 112 is further located between the gate pattern 114a and the first and second dielectric patterns 108a and 108b. In these embodiments, the channel pillar 110 is surrounded by the first and second dielectric patterns 108a and 108b. In addition, the charge storage layer 112 may include an oxide/nitride/oxide multilayer structure, for example.

Regarding vertical connection configuration of the memory device 10, vertically adjacent memory cells MU share one of the conductive patterns 120 therebetween. In these embodiments, the source lines and bit lines are alternately stacked on the substrate 100. In addition, vertically adjacent memory cells MU may be connected in parallel. Furthermore, the memory device 10 may be a NOR flash memory device.

In some embodiments, an end of each gate pattern 114a (i.e., word line) is recessed from an underlying one of the gate patterns 114. In addition, an end of each conductive pattern 102/120 (i.e., source line or bit line) is recessed from an underlying one of the conductive patterns 102/120. In some embodiments, the memory device 10 further includes the contacts $C_W$ and $C_{S/B}$. The contacts $C_W$ are respectively disposed on the ends of the gate patterns 114a. In addition, the contacts $C_{S/B}$ are respectively disposed on the ends of the conductive patterns 102/120.

As above, the memory device includes a stack of memory cells. The memory cell includes a channel pillar penetrating through a gate pattern, and a charge storage layer is formed between the channel pillar and the gate pattern. Vertically adjacent memory cells share one of the conductive patterns therebetween, so as to be connected in parallel. As such, the memory device may be functioned as a NOR flash memory device with a three dimensional structural configuration. Compared to two-dimensional NOR flash, a cell density of the memory device of the present disclosure is greatly improved. As a result of the circuit configuration of NOR flash, the memory device of the present disclosure may achieve high read speed over NAND flash. In addition, with the three dimensional structural configuration, the cell density of the memory device of the present disclosure is able to compete with a cell density of NAND flash. Accordingly, the memory device of the present disclosure is ideal for high-end memory applications such as artificial intelligence (AI) and automotive electronics.

In an aspect of the present disclosure, a manufacturing method of a memory device is provided. Such method comprises: forming a first conductive pattern on a substrate; forming an active structure over the first conductive pattern, wherein the active structure comprises a gate pattern, a channel pillar and a charge storage layer, the gate pattern extends along a first direction, the first conductive pattern extends a second direction intersected with the first direction, the channel pillar penetrates the gate pattern and electrically connects with the first conductive pattern, and the charge storage layer is disposed between the gate pattern and the channel pillar; forming a second conductive pattern over the active structure and extending along the second direction, wherein the second conductive pattern is electrically connected with the channel pillar; and performing formation of the active structure one more time, wherein the channel pillars of the active structures are vertically spaced apart from each other, and electrically connected to the second conductive pattern extending in between the channel pillars.

In another aspect of the present disclosure, a manufacturing method of a memory device is provided. Such method comprises: forming a first signal line on a substrate; forming a charge trap transistor on the first signal line, wherein the charge trap transistor comprises a channel pillar standing on the first signal line, a gate pattern laterally surrounding the channel pillar, two dielectric patterns laterally surrounding the channel pillar and lying above and under the gate pattern, and a charge storage layer lining between the gate pattern and the channel pillar and lining between the gate pattern and the two dielectric patterns; forming a second signal line on the charge trap transistor; and performing formation of the charge trap transistor one more time, such that the channel pillars of the charge trap transistors are vertically separated from each other by the second signal line.

In yet another aspect of the present disclosure, a manufacturing method of a memory device is provided. Such method comprises: forming first signal lines on a substrate, wherein the first signal lines are laterally spaced apart from one another, and extend along the same direction; performing a process cycle; and repeating the process cycle multiple times. The process cycle comprises: forming stack structures on the substrate, wherein the first signal lines are intersected and covered by the stack structures, the stack structures are laterally spaced apart from one another by spacings, and the stack structures respectively comprise two dielectric layers and a sacrifice layer sandwiched by the two dielectric layers; forming through holes in each of the stack structures, wherein the through holes penetrate through the stack structures along a stacking direction of the stack structures; filling a semiconductor material into the through holes to form channel pillars; replacing each of the sacrifice layers with a charge storage layer and a gate pattern; forming isolation structures in the spacings; and forming second signal lines on upper ones of the dielectric layers and the isolation structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a memory device, comprising:
   forming a first conductive pattern on a substrate;
   forming an active structure over the first conductive pattern, wherein the active structure comprises a gate pattern, a channel pillar and a charge storage layer, the gate pattern extends along a first direction, the first conductive pattern extends a second direction intersected with the first direction, the channel pillar penetrates the gate pattern and electrically connects with the first conductive pattern, and the charge storage layer is disposed between the gate pattern and the channel pillar;
   forming a second conductive pattern over the active structure and extending along the second direction, wherein the second conductive pattern is electrically connected with the channel pillar; and performing formation of the active structure one more time, wherein the channel pillars of the active structures are vertically spaced apart from each other, and electrically connected to the second conductive pattern extending in between the channel pillars.

2. The manufacturing method of the memory device of claim 1, wherein formation of the second conductive pattern is repeated one more time, such that an upper one of the active structures is located between and electrically connected to the second conductive patterns.

3. The manufacturing method of the memory device of claim 1, wherein formation of each active structure comprises:
forming a stack structure over the first conductive pattern, wherein the stack structure extends along the first direction, the stack structure comprises a sacrifice pattern sandwiched between a first dielectric pattern and a second dielectric pattern;
forming the channel pillar penetrating through the stack structure;
removing the sacrifice pattern, to form an opening between the first and second dielectric patterns, wherein the opening exposes a sidewall of the channel pillar and opposing surfaces of the first and second dielectric patterns;
conformally forming a charge storage layer on the sidewall of the channel pillar and the opposing surfaces of the first and second dielectric patterns; and
forming the gate pattern to cover the charge storage layer, and to fill up the opening.

4. The manufacturing method of the memory device according to claim 3, wherein the sacrifice pattern is removed by an isotropic etching process.

5. The manufacturing method of the memory device according to claim 3, wherein a method for forming the channel pillar comprises:
forming a through hole in the stack structure; and
filling a semiconductor material in the through hole to form the channel pillar.

6. The manufacturing method of the memory device of claim 1, further comprising forming an insulating layer on the substrate before forming the first conductive pattern.

7. The manufacturing method of the memory device of claim 1, further comprising forming a plurality of contacts electrically connected to the gate pattern, the first conductive pattern and the second conductive pattern, respectively.

8. A manufacturing method of a memory device, comprising:
forming a first signal line on a substrate;
forming a charge trap transistor on the first signal line, wherein the charge trap transistor comprises a channel pillar standing on the first signal line, a gate pattern laterally surrounding the channel pillar, two dielectric patterns laterally surrounding the channel pillar and lying above and under the gate pattern, and a charge storage layer lining between the gate pattern and the channel pillar and lining between the gate pattern and the two dielectric patterns;
forming a second signal line on the charge trap transistor; and
performing formation of the charge trap transistor one more time, such that the channel pillars of the charge trap transistors are vertically separated from each other by the second signal line.

9. The manufacturing method of the memory device according to claim 8, wherein a method for forming each of the charge trap transistors comprises:
forming a stack structure on the substrate, wherein the first signal line is intersected with and covered by the stack structure, and the stack structure comprises two dielectric layers and a sacrifice layer sandwiched in between the two dielectric layers;
forming a through hole in the stack structure, wherein the through hole penetrates through the stack structure along a stacking direction of the stack structure, and remained portions of the two dielectric layers form the two dielectric patterns;
filling a semiconductor material into the through hole, to form the channel pillar; and
replacing remained portion of the sacrifice layer with the charge storage layer and the gate pattern.

10. The manufacturing method of the memory device according to claim 9, wherein a method for replacing the remained portion of the sacrifice layer comprises:
removing the remained portion of the sacrifice layer, to expose a portion of a sidewall of the channel pillar, a top surface of a lower one of the two dielectric patterns, and a bottom surface of an upper one of the two dielectric patterns;
conformally forming the charge storage layer on the exposed portion of the sidewall of the channel pillar, the top surface of the lower one of the two dielectric patterns, and the bottom surface of the upper one of the two dielectric patterns; and
filling up a space between the two dielectric patterns with a conductive material, so as to form the gate pattern.

11. The manufacturing method of the memory device according to claim 10, wherein the remained portion of the sacrifice layer is removed by an isotropic etching process.

12. The manufacturing method of the memory device according to claim 11, wherein the sacrifice layer has an etching selectivity with respect to the two dielectric layers.

13. The manufacturing method of the memory device according to claim 10, wherein the charge storage layer and the gate pattern initially cover sidewalls of the two dielectric patterns, and an anisotropic etching process is further performed to remove portions of the charge storage layer and the gate pattern on the sidewalls of the two dielectric patterns by using the two dielectric patterns as masks.

14. The manufacturing method of the memory device according to claim 8, further comprising forming two isolation structures at opposite sides of a lower one of the charge trap transistors, wherein the second signal line extends on the lower one of the charge trap transistors and the two isolation structures.

15. A manufacturing method of a memory device, comprising:
forming first signal lines on a substrate, wherein the first signal lines are laterally spaced apart from one another, and extend along the same direction;
performing a process cycle comprising:
forming stack structures on the substrate, wherein the first signal lines are intersected and covered by the stack structures, the stack structures are laterally spaced apart from one another by spacings, and the stack structures respectively comprise two dielectric layers and a sacrifice layer sandwiched by the two dielectric layers;
forming through holes in each of the stack structures, wherein the through holes penetrate through the stack structures along a stacking direction of the stack structures;
filling a semiconductor material into the through holes to form channel pillars;

replacing each of the sacrifice layers with a charge storage layer and a gate pattern;
forming isolation structures in the spacings; and
forming second signal lines on upper ones of the dielectric layers and the isolation structures; and
repeating the process cycle multiple times.

16. The manufacturing method of the memory device according to claim 15, wherein the process cycle further comprises:
filling the spacings between the stack structures by insulating structures before forming the through holes.

17. The manufacturing method of the memory device according to claim 16, wherein the insulating structures are removed during replacement of the sacrifice layers.

18. The manufacturing method of the memory device according to claim 17, wherein the insulating structures and the sacrifice layers are made of the same material.

19. The manufacturing method of the memory device according to claim 17, wherein a method for replacing the sacrifice layers with the charge storage layers and the gate patterns comprises:

removing the sacrifice layers and the insulating structures by an isotropic etching process;
conformally forming a charge storage material layer on exposed surfaces of the dielectric layers and the channel pillars;
filling up spaces previously occupied by the sacrifice layers and the insulating structures by a gate material; and
removing portions of the charge storage material layer and portions of the gate material by an anisotropic etching process using the dielectric layers as masks, such that the remained portions of the charge storage material layer form the charge storage layers, and the remained portions of the gate material form the gate patterns.

20. The manufacturing method of the memory device according to claim 15, further comprising forming an insulating layer on the substrate before forming the first signal lines.

* * * * *